(12) United States Patent
Takahashi et al.

(10) Patent No.: US 12,248,142 B2
(45) Date of Patent: Mar. 11, 2025

(54) OPTICAL SCANNING DEVICE

(71) Applicants: Yuki Takahashi, Tokyo (JP);
Masaharu Kagami, Tokyo (JP);
Yasutaka Kitamura, Tokyo (JP);
DENSO CORPORATION, Aichi (JP)

(72) Inventors: Yuki Takahashi, Tokyo (JP);
Masaharu Kagami, Tokyo (JP);
Yasutaka Kitamura, Tokyo (JP)

(73) Assignees: MITSUMI ELECTRIC CO., LTD.,
Tokyo (JP); DENSO CORPORATION,
Aichi (JP)

( * ) Notice: Subject to any disclaimer, the term of this patent is extended or adjusted under 35 U.S.C. 154(b) by 490 days.

(21) Appl. No.: 17/783,892

(22) PCT Filed: Dec. 11, 2020

(86) PCT No.: PCT/JP2020/046260
§ 371 (c)(1),
(2) Date: Jun. 9, 2022

(87) PCT Pub. No.: WO2021/117863
PCT Pub. Date: Jun. 17, 2021

(65) Prior Publication Data
US 2023/0026476 A1 Jan. 26, 2023

(30) Foreign Application Priority Data
Dec. 13, 2019 (JP) .................. 2019-225574

(51) Int. Cl.
G02B 26/10 (2006.01)
G01B 11/26 (2006.01)
H01F 7/08 (2006.01)

(52) U.S. Cl.
CPC .......... *G02B 26/105* (2013.01); *G01B 11/26* (2013.01); *H01F 7/081* (2013.01)

(58) Field of Classification Search
CPC ........ G02B 26/105; G01B 11/26; H01F 7/081
See application file for complete search history.

(56) References Cited

U.S. PATENT DOCUMENTS

2021/0184554 A1* 6/2021 Takahashi ............ H02K 33/12

FOREIGN PATENT DOCUMENTS

| JP | 2007-333873 A | 12/2007 |
| JP | 2014-182167 A | 9/2014 |

OTHER PUBLICATIONS

International Search Report from International Application No. PCT/JP2020/046260 mailed Mar. 2, 2021.

* cited by examiner

*Primary Examiner* — Lucy P Chien
(74) *Attorney, Agent, or Firm* — Shih IP Law Group, PLLC

(57) ABSTRACT

This optical scanning device includes: a shaft part to which a mirror part is connected; a movable magnet; a base part; a ball bearing; a core unit that has a core body and a coil body and rotationally drives the movable magnet; and a magnet position holding member that is a magnetic body provided facing the movable magnet and magnetically attracts the movable magnet to a reference position. The core unit is disposed on the outer surface side of one wall section of a pair of wall sections of the base part. An angle sensor unit for detecting the rotation angle position of the shaft part is disposed between the core unit and the one wall section.

5 Claims, 7 Drawing Sheets

OPTICAL SCANNING DEVICE

TECHNICAL FIELD

The present invention relates to an optical scanning device that use light for scanning by driving a mirror to rotate in a reciprocating manner.

BACKGROUND ART

Conventional optical scanning devices that uses light for scanning by driving a mirror to rotate in a reciprocating manner are disclosed in Patent Literatures (hereinafter, referred to as PTL) 1 and 2.

CITATION LIST

Patent Literature

PTL 1
Japanese Patent Application Laid-Open No. 2007-333873
PTL 2
Japanese Patent Application Laid-Open No. 2014-182167

SUMMARY OF INVENTION

Technical Problem

As described in PTL 1, an optical scanning device is provided with an angle sensor for detecting the rotation angle of a rotating shaft connected to a mirror.

A reduced detection accuracy of an angle sensor in the optical scanning device results in the reduction of the accuracy of angle control during optical scanning It is thus required that the angle sensor performs accurate sensing.

In addition, an optical scanning device typically occupies a large proportion of the entire product, thus a smaller optical scanning device can reduce the size of the entire product. Therefore, the reduction of the size of the optical scanning device is required.

For mounting the optical scanning device in, for example, a LIDAR (Laser Imaging Detection and Ranging) device, when an angle sensor is exposed to the outside of the optical scanning device, the angle sensor may come into contact with peripheral parts to be damaged. The angle sensor is thus preferably disposed so as not to be exposed to the outside, but such a configuration may make the structure of an optical scanning device complicated, which leads to the increased size of the optical scanning device.

The present invention is made in consideration of the above points, and provides an optical scanning device that has a compact structure, yet has satisfactory sensing accuracy of an angle sensor and can prevent damage to the angle sensor part.

Solution to Problem

An optical scanning device of the present invention in one aspect includes:
a shaft part to which a minor is connected;
a movable magnet fixed to the shaft part;
a base;
a bearing that attaches the shaft part to the base rotatably;
a core unit including a core and a coil, the core unit configured to drive the movable magnet rotationally; and
a position holding member that attracts the movable magnet to a reference position magnetically, the position holding member being a magnetic material that is provided in the core unit and faces the movable magnet,
in which:
the base includes a pair of wall parts each provided with a notched hole through which the shaft part is inserted via the bearing,
the core unit is disposed on a side of an outer surface of one wall part of the pair of the wall parts, and
an angle sensor part configured to detect a rotation angle position of the shaft part is disposed between the core unit and the one wall part.

Advantageous Effects of Invention

The present invention can provide an optical scanning device that has a compact structure, yet has satisfactory sensing accuracy of an angle sensor part and can prevent damage to the angle sensor part by disposing the angle sensor between a core unit and one of the wall parts of a base.

DESCRIPTION OF EMBODIMENTS

Hereinafter, one or more embodiments of the present invention will be described with reference to the drawings.

Figure 1:
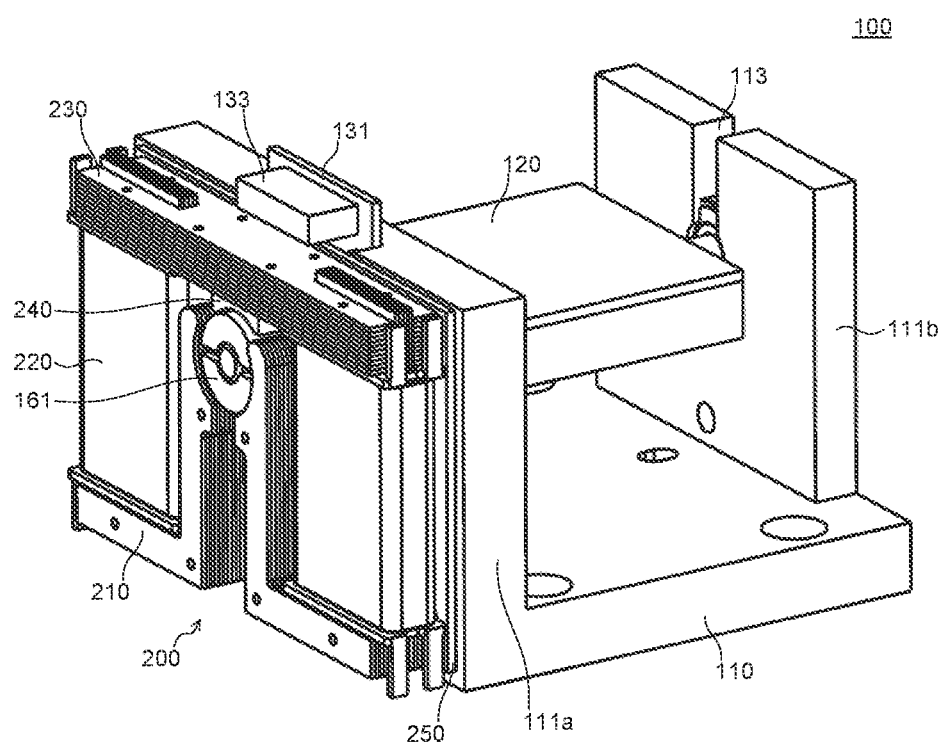
FIG. 1 is an external perspective view of an optical scanning device of an embodiment.
Figure 2:
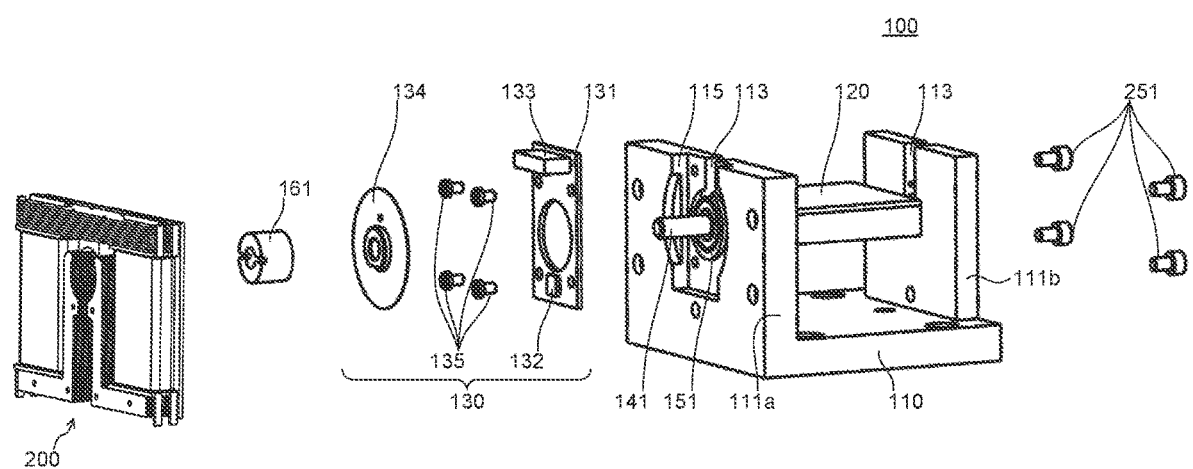
FIG. 2 is an exploded perspective view of the optical scanning device.
Figure 3:
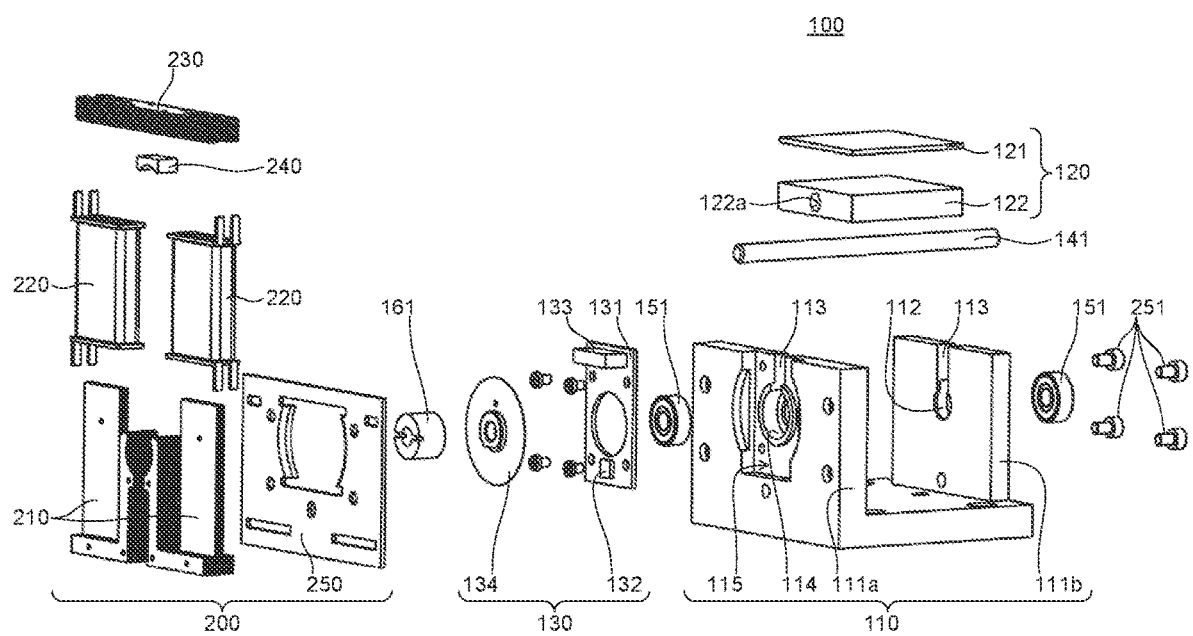
FIG. 3 is an exploded perspective view of the optical scanning device.
Figure 4:
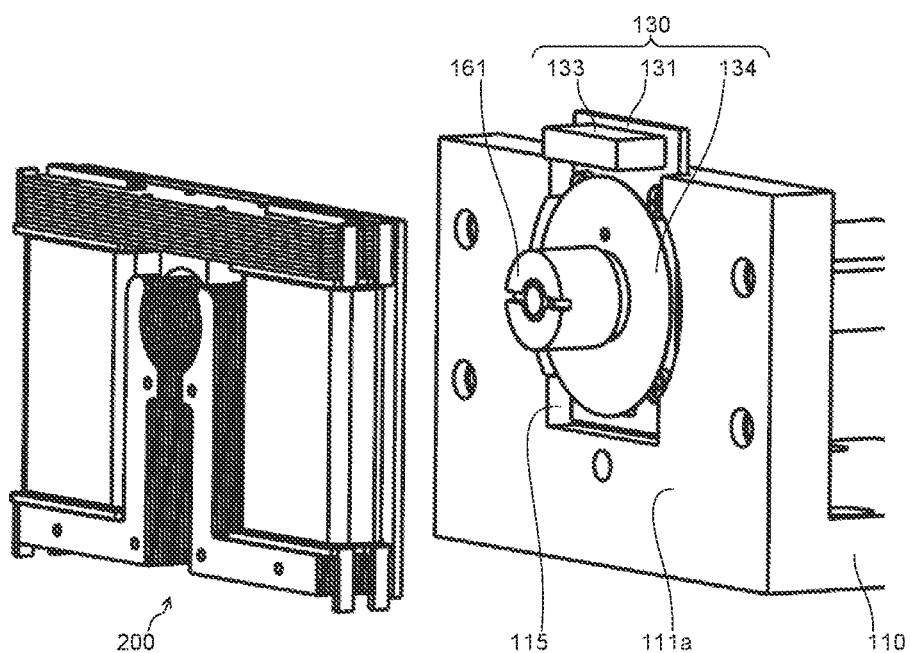
FIG. 4 is a perspective view illustrating the vicinity of an angle sensor part.
Figure 5:
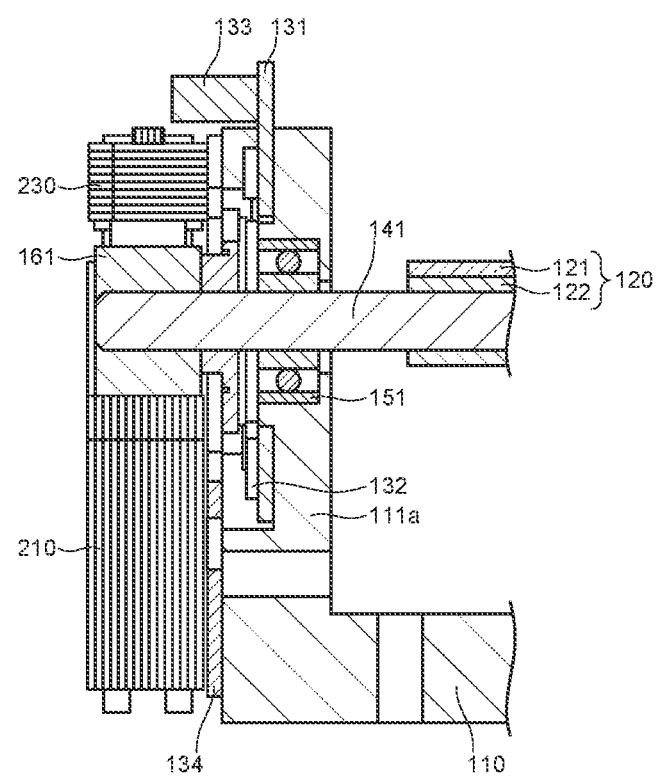
FIG. 5 is a cross-sectional view illustrating the vicinity of the angle sensor part.

FIG. 1 is an external perspective view of optical scanning device 100 of an embodiment. FIGS. 2 and 3 are exploded perspective views of optical scanning device 100. FIGS. 2 and 3 are both exploded perspective views, but the parts of the device are more disassembled in FIG. 3 than in FIG. 2. FIG. 4 is a perspective view illustrating the vicinity of angle sensor part 130, and FIG. 5 is a cross-sectional view illustrating the vicinity of angle sensor part 130. Hereinafter, the configuration of optical scanning device 100 will be described with reference to FIGS. 1 to 5.

Optical scanning device 100 is used, for example, in a LIDAR device. Optical scanning device 100 is also applicable to a multifunction peripheral, a laser beam printer, and other apparatuses.

Optical scanning device 100 includes, as main parts, base part 110; mirror part 120 rotatably supported by base part 110; core unit 200 configured to drive mirror part 120 rotationally; and angle sensor part 130 configured to detect the rotation angle position of mirror part 120.

As illustrated in FIG. 3, mirror part 120 includes plate-shaped mirror 121 attached to one surface of board 122.

Shaft part 141 is inserted through insertion hole 122a of board 122, and board 122 and shaft part 141 are fastened to each other.

Base part 110 is a member including a pair of wall parts 111a and 111b and having a substantially U-shaped cross section. Insertion holes 112 through which shaft part 141 is inserted are formed in the pair of wall parts 111a and 111b, respectively. Further, notched holes 113 that allows insertion holes 112 to communicate with the outer edges of wall parts 111a and 111b are formed in the pair of wall parts 111a and 111b, respectively.

This configuration allows shaft part 141 with mirror part 120 fastened thereto to be placed to the positions of insertion holes 112 via notched holes 113. Without notched holes 113, a complicated assembly operation would be required, for example, inserting shaft part 141 through all the insertion holes, namely insertion holes 112 of the pair of wall parts 111a and 111b and insertion hole 122a of board 122, while mirror part 120 is disposed between wall parts 111a and 111b, and further fastening shaft part 141 and board 122 to each other. On the other hand, as notched holes 113 are formed in the present embodiment, shaft part 141 to which mirror part 120 is fastened in advance can be easily inserted through insertion holes 112.

Ball bearings 151 are attached to both ends of shaft part 141. Ball bearings 151 are attached to bearing mounting parts 114 formed at the positions of insertion holes 112 of the pair of wall parts 111a and 111b, respectively. Shaft part 141 is thus rotatably attached to base part 110 via ball bearings 151.

Further, movable magnet 161 is fastened to one end of shaft part 141. Movable magnet 161 is disposed in core unit 200 and is rotationally driven by a magnetic flux generated by core unit 200.

As illustrated in FIG. 3, core unit 200 includes core bodies 210 and coil bodies 220. A wound coil is provided inside coil body 220. Coil body 220 is attached to core body 210 by being inserted into a part of the core body. This configuration allows energizing of the coil of coil body 220 to excite core body 210.

Core bodies 210 and coil bodies 220 are fixed to fixing plate 250, and fixing plate 250 is fixed to wall part 111a of base part 110 via fasteners 251.

In the example of the present embodiment, core unit 200 further includes bridge core 230 and magnet position holding member 240. Bridge core 230 has a similar configuration to core body 210. Magnet position holding member 240 is composed of a magnet. The position of movable magnet 161 is magnetically attracted to the movement reference position by the magnetic force of magnet position holding member 240. This configuration will be described in detail below.

In the example of the present embodiment, core body 210 and bridge core 230 are laminated cores, and are configured by stacking, for example, silicon steel plates.

Angle sensor part 130 includes circuit board 131, optical sensor 132 and connector 133, which are mounted on circuit board 131, and code wheel (which may be referred to as an encoder disk) 134. Code wheel 134 is fastened to shaft part 141 and rotates integrally with movable magnet 161 and mirror part 120. Light sensor 132 emits light toward code wheel 134 and detects the rotation position (angle) of code wheel 134 based on the reflected light. This configuration allows optical sensor 132 to detect the rotation position of movable magnet 161 and mirror part 120.

In optical scanning device 100 of the present embodiment, angle sensor part 130 is disposed between core unit 200 and wall part 111a.

This configuration allows angle sensor part 130 to be disposed so as to be surrounded by core unit 200 and wall part 111a, and thus is protected by core unit 200 and wall part 111a. Therefore, for example, damage to angle sensor part 130 during the installation of optical scanning device 100 can be prevented.

In addition, angle sensor part 130 can perform the detection of the rotation position in the vicinity of both core unit 200, which is the rotation drive source, and mirror part 120, which is the rotation target. This configuration can perform satisfactory position detection from the viewpoints of highly accurate rotation drive control and highly accurate rotation target position control.

Circuit board 131 is disposed so as to be accommodated in recess 115 formed in the outer surface—facing the core unit 200—of wall part 111a. In practice, as illustrated in FIG. 2, after mirror part 120, shaft part 141, and ball bearings 151 are attached to wall parts 111a and 111b of base part 110, circuit board 131, on which optical sensor 132 and connector 133 are mounted, is placed into recess 115 and fixed to wall part 111a with fasteners 135. Code wheel 134 and movable magnet 161 are then fastened to shaft part 141. Subsequently, core unit 200 is fixed to wall part 111a with fasteners 251.

Figure 6:
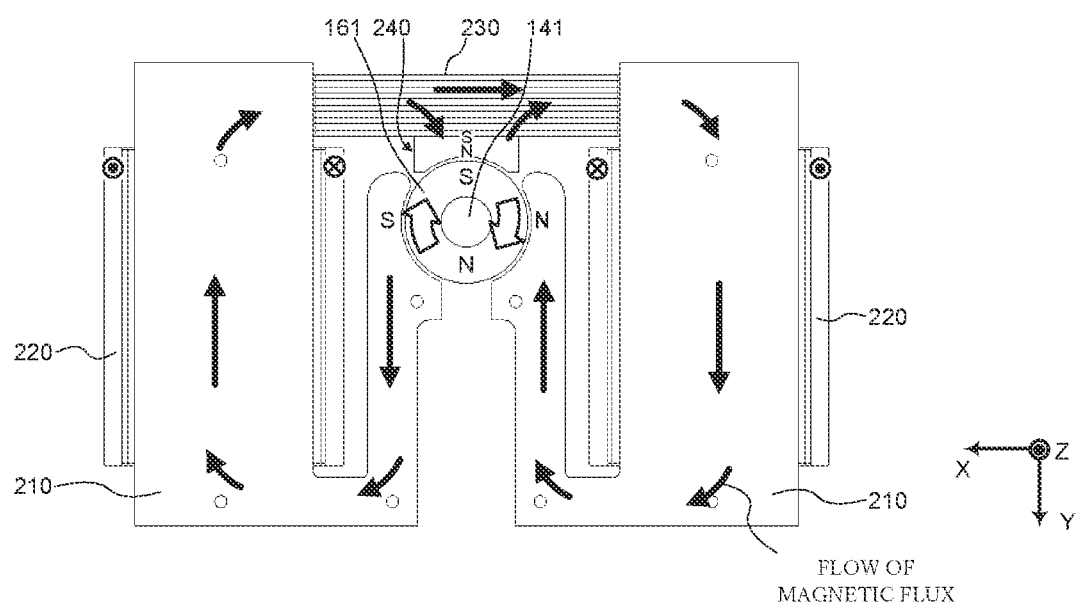
FIG. 6 is a diagram provided for explaining the movement of a rotary reciprocating drive according to an embodiment.

FIG. 6 is a diagram provided for explaining the movement of a rotary reciprocating drive according to the present embodiment.

When the coils in coil bodies 220 are not energized, movable magnet 161 is stopped at the movement reference position by the magnetic attraction force between magnet position holding member 240 and movable magnet 161, that is, the magnetic spring.

When the coils in coil bodies 220 are energized, core bodies 210 and bridge core 230 are excited, a magnetic flux is generate in the direction along the arrows in FIG. 6 or in the opposite direction depending on the direction of the current, thereby driving movable magnet 161 to rotate in a reciprocating manner. In other words, movable magnet 161 is rotated to a desired angle in the clockwise direction or the counterclockwise direction with the movement reference position as the center.

Due to the presence of magnet position holding member 240 in core unit 200 of the present embodiment, movable magnet 161 is magnetically attracted to its neutral position (movement reference position) by magnet position holding member 240. The reciprocating rotation drive with improved energy efficiency and responsiveness thus can be achieved.

As described above, optical scanning device 100 of the present embodiment includes the following: shaft part 141 to which mirror part 120 is connected; movable magnet 161 fixed to shaft part 141; base part 110; ball bearings 151 that attach shaft part 141 to base part 110 rotatably; core unit 200, which includes core bodies 210 and coil bodies 220, and rotationally drives movable magnet 161; and magnet position holding member 240, which is a magnetic material provided in the core unit 200 and facing movable magnet 161, and magnetically attracts movable magnet 161 to a reference position. Base part 110 includes a pair of wall parts 111a and 111b each provided with notched hole 113. Core unit 200 is disposed on the outer surface side of wall part 111a, namely one wall part of the pair of wall parts 111a and 111b.

The present embodiment can provide optical scanning device 100 that has a compact structure, yet has satisfactory sensing accuracy of an angle sensor and can prevent damage to angle sensor part 130 by disposing the angle sensor between core unit 200 and wall part 111a as in the configuration described above.

In other words, one advantage is as follows: no additional structure for fixing and protecting angle sensor part 130 is required, thus the number of parts can be reduced and the size of the entire product can be reduced.

Another advantage is as follows: due to the disposition of angle sensor part 130 between core unit 200 and wall part 111a, angle sensor part 130 can perform the detection of the rotation position in the vicinity of both core unit 200, which is the rotation drive source, and mirror part 120, which is the rotation target. This configuration can perform satisfactory position detection such that both the highly accurate rotation drive control and the highly accurate rotation target position control can be achieved.

In addition, angle sensor part 130 in the present embodiment includes optical sensor 132, code wheel 134, and connector 133. In this configuration, the angle is detected by using light, thus disposition of angle sensor part 130 in the vicinity of movable magnet 161 does not adversely affect the sensor detection. Therefore, for example, code wheel 134 can be disposed close to movable magnet 161, thereby contributing to the size reduction. In other words, for using a magnetic type sensor as angle sensor part 130, it is necessary to increase the distance between angle sensor part 130 and movable magnet 161 to some extent for preventing magnetic interference with movable magnet 161. This results in a drawback such that the size of optical scanning device 100 becomes large. The configuration of the present embodiment can prevent such a drawback. This configuration includes connector 133, thus the cable (not illustrated) for sensor output can be separated from angle sensor part 130. Therefore, compared to a configuration in which a cable integral with angle sensor part 130 is led out, workability is improved in the present embodiment as the cable can be separated from angle sensor part 130 at the time of assembly or adjustment.

In addition, the present embodiment has the following features. Angle sensor part 130 includes circuit board 131; optical sensor 132 and connector 133, both mounted on circuit board 131; and code wheel 134 fixed to movable magnet 161. Circuit board 131 is disposed so as to be accommodated in recess 115 formed in the outer surface of wall part 111a. This configuration allows angle sensor part 130 to be disposed so as to be embedded in wall part 111a, thus core unit 200 can be attached to the outer surface of wall part 111a with no gap or at a small distance, thereby further reducing the size of optical scanning device 100.

In the present embodiment, angle sensor part 130 is configured in such a way that light from angle sensor part 130 to the outside of the optical scanning device and/or light from the outside of the optical scanning device to angle sensor part 130 are blocked. This configuration can prevent the optical noise generated by the interference between the light emitted from optical sensor 132 and the scanning light. In addition, a decrease in angle detection accuracy caused by light from the outside, such as sunlight, light from lighting, and scanning light, incident on optical sensor 132 can be prevented. As a result, high quality optical scanning can be performed.

In practice, this light-blocking function is achieved by attaching angle sensor part 130 between wall part 111a and core unit 200 with no gap or at a small distance between the angle sensor part and the core unit or the wall part. Connector 133 also partly contributes to this light-blocking function in the present embodiment. As illustrated in FIG. 1, connector 133 is disposed so as to close a part of the gap between wall part 111a and core unit 200, therefore blocks a part of the light from angle sensor part 130 to the outside and a part of the light from the outside to angle sensor part 130.

The embodiment disclosed herein is merely an exemplification and should not be considered as limitative. While the present invention has been specifically described based on the preferred embodiments, it is not intended to limit the present invention to the above-mentioned preferred embodiments, but the present invention may be further modified within the scope and spirit of the invention defined by the appended claims.

The above embodiment describes using ball bearing 151 as a bearing for rotatably attaching shaft part 141 to base part 110, but the present invention is not limited thereto. As the bearing, for example, an air bearing or an oil bearing may be used.

The above embodiment describes using connector 133 provided in angle sensor part 130 for blocking light from angle sensor part 130 to the outside and/or light from the outside to angle sensor part 130. However, the connector is not the only part for the light blocking, and the connector and the cable connected thereto in combination can block light. Alternatively, a cable solely can block light.

Figure 7:
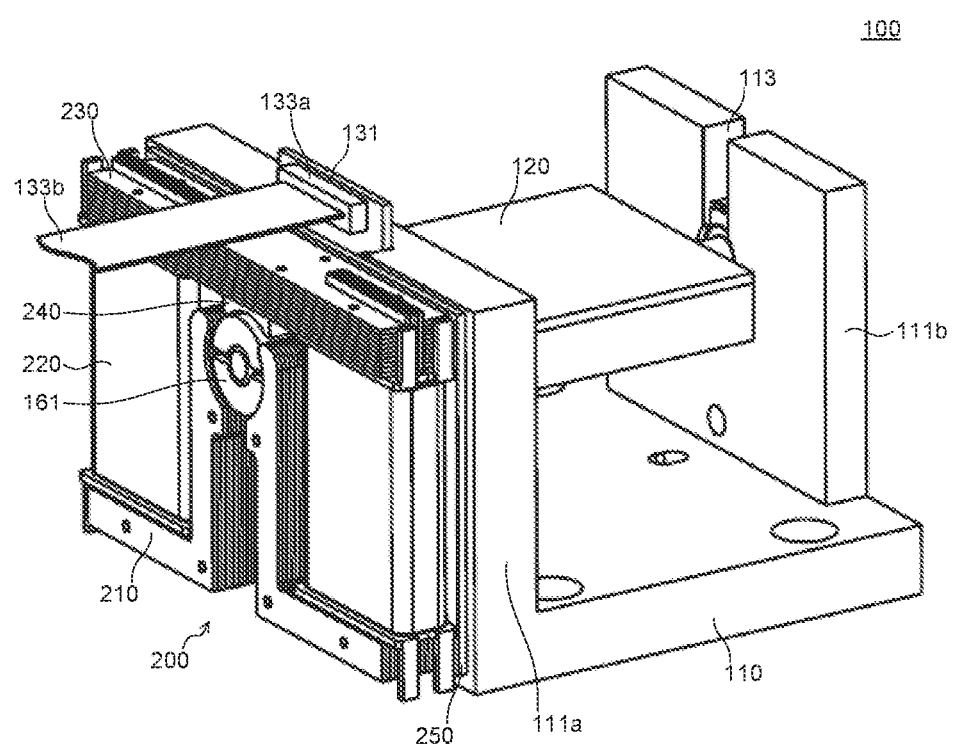
FIG. 7 is an external perspective view of the optical scanning device illustrating a cable connected to a connector.

As illustrated in FIG. 7 with the parts corresponding to those in FIG. 1 are designated by the same reference numerals, cable 133b is connected to connector 133a. In practice, connector 133a and cable 133b are disposed so as to close a part of the gap between wall part 111a and core unit 200; therefore connector 133a and cable 133b block a part of the light from angle sensor part 130 to the outside and a part of the light from the outside to angle sensor part 130, in this configuration. For using angle sensor part 130 from which a cable is directly led out from circuit board 131, i.e., using angle sensor part 130 without connector 133 (133a), disposing the cable so as to close a part of the gap between wall part 111a and core unit 200 can achieve the above-described light blocking.

This application claims priority based on Japanese Patent Application No. 2019-225574, filed on Dec. 13, 2019, the entire contents of which including the specification and the drawings are incorporated herein by reference.

INDUSTRIAL APPLICABILITY

The present invention is suitable for, for example, a LIDAR device.

REFERENCE SIGNS LIST

100 Optical scanning device
110 Base part
111a, 111b Wall part
112 Insertion hole
113 Notched hole
114 Bearing mounting part
115 Recess
120 Mirror part
121 Mirror
122 Board
122a Insertion hole
130 Angle sensor part
131 Circuit board
132 Optical sensor
133, 133a Connector
133b Cable

134 Code wheel
135, 251 Fastener
141 Shaft part
151 Ball bearing
161 Movable magnet
200 Core unit
210 Core body
220 Coil body
230 Bridge core
240 Magnet position holding member
250 Fixing plate

What is claimed is:

1. An optical scanning device, comprising:
    a shaft part to which a mirror is connected;
    a movable magnet fixed to the shaft part;
    a base;
    a bearing that attaches the shaft part to the base rotatably;
    a core unit including a core and a coil, the core unit configured to drive the movable magnet rotationally; and
    a position holding member that attracts the movable magnet to a reference position magnetically, the position holding member being a magnetic material that is provided in the core unit and faces the movable magnet,
    wherein:
    the base includes a pair of wall parts each provided with a notched hole through which the shaft part is inserted via the bearing,
    the core unit is disposed on a side of an outer surface of one wall part of the pair of the wall parts, and
    an angle sensor part configured to detect a rotation angle position of the shaft part is disposed between the core unit and the one wall part.

2. The optical scanning device according to claim 1, wherein:
    the angle sensor part includes an optical sensor, a code wheel, and a connector.

3. The optical scanning device according to claim 1, wherein:
    the angle sensor part includes a circuit board, an optical sensor and a connector both mounted on the circuit board, and a code wheel fixed to the movable magnet; and
    the circuit board is disposed so as to be accommodated in a recess formed in the outer surface of the one wall part.

4. The optical scanning device according to claim 1, wherein:
    the angle sensor part is configured in such a way that light from the angle sensor part to an outside of the optical scanning device and/or light from the outside to the angle sensor part is blocked.

5. The optical scanning device according to claim 4, wherein:
    the light is blocked by a connector provided in the angle sensor part and/or a cable connected to the circuit board.

* * * * *